United States Patent
Gunturi et al.

(10) Patent No.: US 10,574,246 B2
(45) Date of Patent: Feb. 25, 2020

(54) DIGITAL DOWNCONVERTER WITH DIGITAL OSCILLATOR FREQUENCY ERROR CORRECTION

(71) Applicant: TEXAS INSTRUMENTS INCORPORATED, Dallas, TX (US)

(72) Inventors: Sarma Sundareswara Gunturi, Bengaluru (IN); Sundarrajan Rangachari, Trichy (IN); Aswath Vs, Kannur (IN); Raunak Dhaniwala, Jaipur (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 165 days.

(21) Appl. No.: 15/949,294

(22) Filed: Apr. 10, 2018

(65) Prior Publication Data

US 2019/0207612 A1    Jul. 4, 2019

Related U.S. Application Data

(60) Provisional application No. 62/611,878, filed on Dec. 29, 2017.

(51) Int. Cl.
*H03L 7/24* (2006.01)
*H03K 21/38* (2006.01)
*H03L 7/02* (2006.01)

(52) U.S. Cl.
CPC ............ *H03L 7/24* (2013.01); *H03K 21/38* (2013.01); *H03L 7/02* (2013.01)

(58) Field of Classification Search
CPC combination set(s) only.
See application file for complete search history.

(56) References Cited

U.S. PATENT DOCUMENTS

| 5,815,220 A  * | 9/1998 | Marshall | H04N 9/66 348/663 |
| 6,121,816 A  * | 9/2000 | Tonks | G06F 1/08 327/12 |
| 2007/0067123 A1* | 3/2007 | Jungerman | G06F 1/0321 702/67 |
| 2016/0277030 A1* | 9/2016 | Burbano | H03K 23/40 |

* cited by examiner

*Primary Examiner* — Jeffrey M Shin
(74) *Attorney, Agent, or Firm* — John R. Pessetto; Charles A. Brill; Frank D. Cimino (57) ABSTRACT

A digital local oscillator includes a look-up table and oscillator control circuitry. The look-up table contains samples of the digital local oscillator signal. The oscillator control circuitry is configured to select samples from the look-up table based on an accumulated phase value. The oscillator control circuitry is also configured to add a correction value to the accumulated phase value based on a difference of a frequency of the digital local oscillator signal and a desired frequency.

20 Claims, 5 Drawing Sheets

DIGITAL DOWNCONVERTER WITH DIGITAL OSCILLATOR FREQUENCY ERROR CORRECTION

CROSS-REFERENCE TO RELATED APPLICATIONS

The present application claims priority to U.S. Provisional Patent Application No. 62/611,878, filed Dec. 29, 2017, titled "Digital Downconverter With Digital Oscillator Frequency Error Correction," which is hereby incorporated herein by reference in its entirety.

BACKGROUND

In wireless transceivers, down converters transform a radio frequency (RF) signal into a baseband signal centered at the zero frequency. Similarly, up converters transform a baseband signal into an RF signal. Down conversion and up conversion have traditionally been performed in the analog domain. However, the next generation of wireless transceivers perform down conversion and/or up conversion in the digital domain. For example, a receiver may employ RF sampling, in which the RF signal is directly sampled with a high speed, high performance analog-to-digital converter (ADC) (e.g., a 14 bit, 3 giga-sample-per-second ADC). The use of RF sampling allows such receivers to employ digital down-converters that avoid mixers in the RF/analog domain. In a digital down-converter, mixing is implemented using digital multiplication circuitry.

SUMMARY

An apparatus and method for synchronizing the frequency of a digital local oscillator with the frequency of an analog local oscillator, such as for use in a wireless receiver, transmitter, or transceiver are disclosed herein. According to aspects of the disclosure, a digital local oscillator includes a look-up table and oscillator control circuitry. The look-up table contains samples of a digital local oscillator signal. The oscillator control circuitry is configured to select samples of the digital local oscillator signal from the look-up table based on an accumulated phase value, and to update the accumulated phase value based on a frequency control value. The oscillator control circuitry is also configured to add a correction value to the accumulated phase value based on a difference of a frequency of the digital local oscillator signal and a desired frequency being at least as great as a frequency specified by a predetermined number of least significant bits (LSBs) of the accumulated phase value.

According to other aspects of the disclosure, a method for generating a digital local oscillator signal includes selecting samples of the digital local oscillator signal from a digital local oscillator signal look-up table based on an accumulated phase value, and updating the accumulated phase value based on a frequency control value. Generating the digital local oscillator signal also includes adding a correction value to the frequency control value based on a difference of a frequency of the digital local oscillator signal and a desired frequency being at least as great as a frequency specified by a predetermined number of least significant bits (LSBs) of the accumulated phase value.

According to other aspects of the disclosure, a radio frequency transceiver includes a digital local oscillator. The digital local oscillator is configured to generate a digital local oscillator signal for use in up converting or down converting a digitized signal. The digital local oscillator includes a look-up table, a phase accumulator, and oscillator control circuitry. The look-up table contains samples of the digital oscillator signal. The phase accumulator is configured to update an accumulated phase value based on a frequency control value. The oscillator control circuitry is configured to synchronize a frequency of the digital oscillator signal to a desired frequency. The desired frequency is not an integer multiple of a frequency resolution of the digital local oscillator. The oscillator control circuitry is also configured to add a correction value to the accumulated phase value based on a difference of the frequency of the digital local oscillator signal and the desired frequency being at least as great as a frequency specified by a predetermined number of least significant bits (LSBs) of the accumulated phase value. The oscillator control circuitry is further configured to determine a number of LSBs of adjustment to apply to the accumulated phase value, and to determine a number of clock cycles over which the number of LSBs of adjustment is to be applied. The number of LSBs and the number of clock cycles are determined based on the desired frequency, a frequency of the clock cycles, and a number of bits in the accumulated phase value.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In wireless transmitters and receivers (including transceivers), mixing may be performed in the analog domain or in the digital domain. Mixing in the analog domain employs an analog local oscillator, while mixing in the digital domain employs a digital local oscillator. In wireless transceivers that employ mixing in the analog domain and in the digital domain, it is desirable for the digital local oscillator to produce the same frequencies as the analog local oscillator. For example, the analog local oscillator may be capable of producing frequencies at all integer multiples of 100 kilohertz (KHz), in which case it is desirable for the digital local oscillator to be able to produce frequencies at all integer multiples of 100 KHz. Design constraints can limit frequency resolution of a digital local oscillator, which can inhibit the generation of frequencies that exactly match the frequencies produced by analog local oscillators.

A digital downconverter according to the disclosure can include a digital local oscillator circuit that dynamically adjusts the value of accumulated phase used to address a digital oscillator signal look-up table so that the frequency produced by the digital local oscillator is the same as the frequency generated by an analog local oscillator. Example oscillator control circuitry determines a time period over which correction is to be applied, and splits a value specifying the time period into integer and fractional parts. Counters accumulate time based on the integer and fractional parts, and enable an adjustment to the phase value used to access the digital oscillator signal look-up table based on the outputs of the counters.

Figure 1:
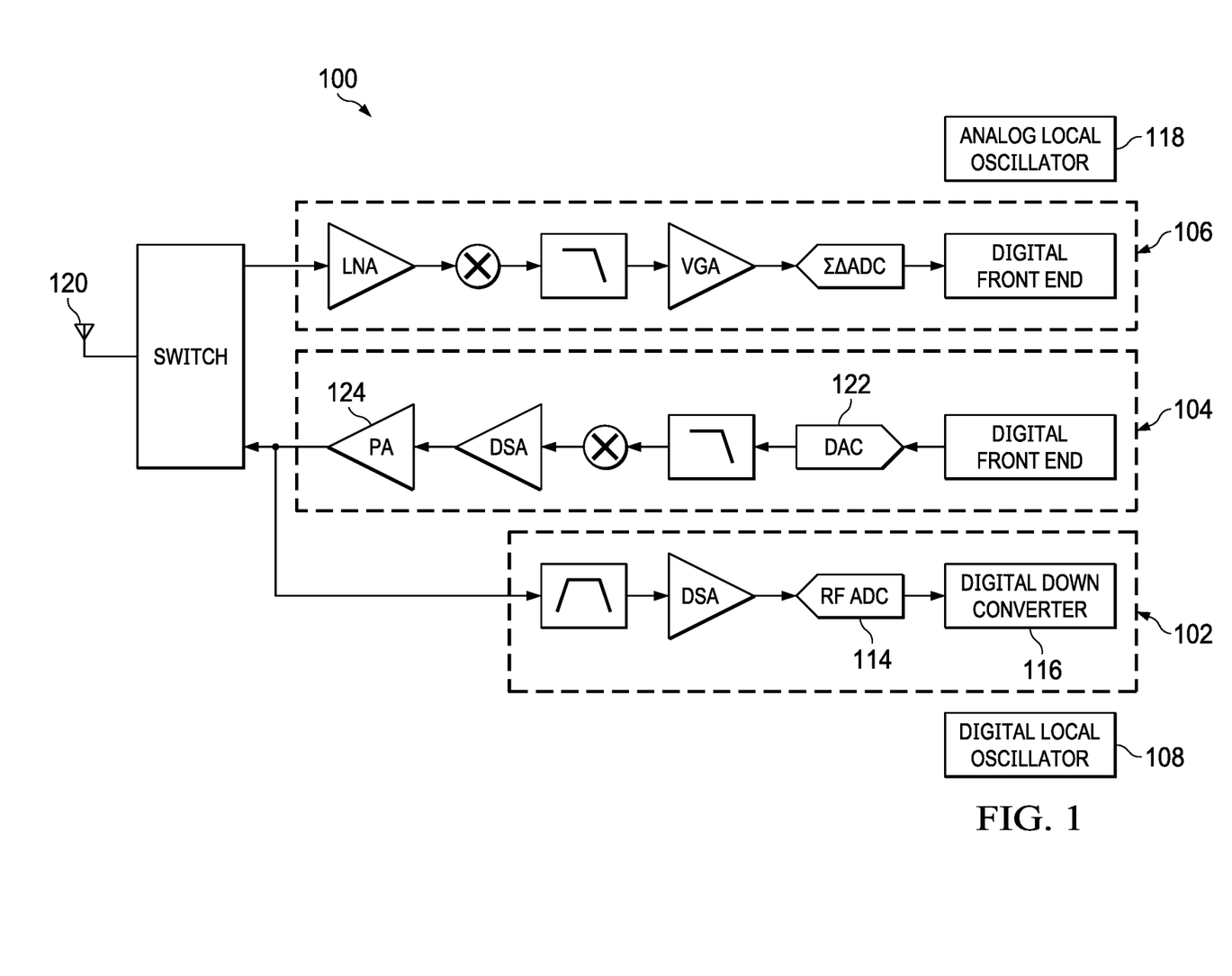
FIG. 1 shows a block diagram for an example wireless transceiver in accordance with the disclosure.

FIG. 1 shows a block diagram for an example wireless transceiver 100 in accordance with the disclosure. The wireless transceiver 100 may be applied in a radio frequency (RF) base station or other RF wireless device that provides for transmission and reception of information. The wireless transceiver 100 includes an RF receiver 106, an RF transmitter 104, and a feedback channel 102. The RF receiver 106 and the RF transmitter 104 are zero-IF circuits. An analog local oscillator 118 provides an analog local oscillator signal used by the RF receiver 106 to down convert RF signals received via the antenna 120. Similarly, the RF transmitter 104 uses the analog local oscillator signal provided by the analog local oscillator 118 to up convert analog signals generated by the digital-to-analog converter 122. The analog local oscillator 118 may include a phase-locked loop (PLL) that is capable of producing a wide range of frequencies with accuracy. For example, the PLL may allow the analog local oscillator 118 to generate analog local oscillator signals for all integer multiples of 100 KHz without substantial error.

The feedback channel 102 is coupled to the output of the RF transmitter 104. The feedback channel includes an RF analog-to-digital converter (ADC) 114 a digital step attenuator (DSA), and a digital down converter 116. The RF ADC 114 receives, via the DSA, the RF signal output by the power amplifier 124, and digitizes the received RF signal. The digital down converter 116 mixes the signal samples produced by the RF ADC 114 with digital oscillator samples (i.e., digital local oscillator signal) generated by the digital local oscillator 108 to down convert the output of the RF transmitter 104. The down converted RF transmitter output signal provided by the feedback channel 102 may be used, for example, to determine how the signal provided to the power amplifier 124 should be predistorted. A small difference in frequency between the signal generated by the analog local oscillator 118 and the signal generated by the digital local oscillator 108 can result in degradation of the performance of the RF transmitter 104. The digital local oscillator 108 includes phase adjustment circuitry that allows the digital local oscillator 108 to provide output frequencies that are the same as those provided by the analog local oscillator 118, thereby avoid degradation in RF transmitter performance caused by frequency mismatch.

Figure 2:
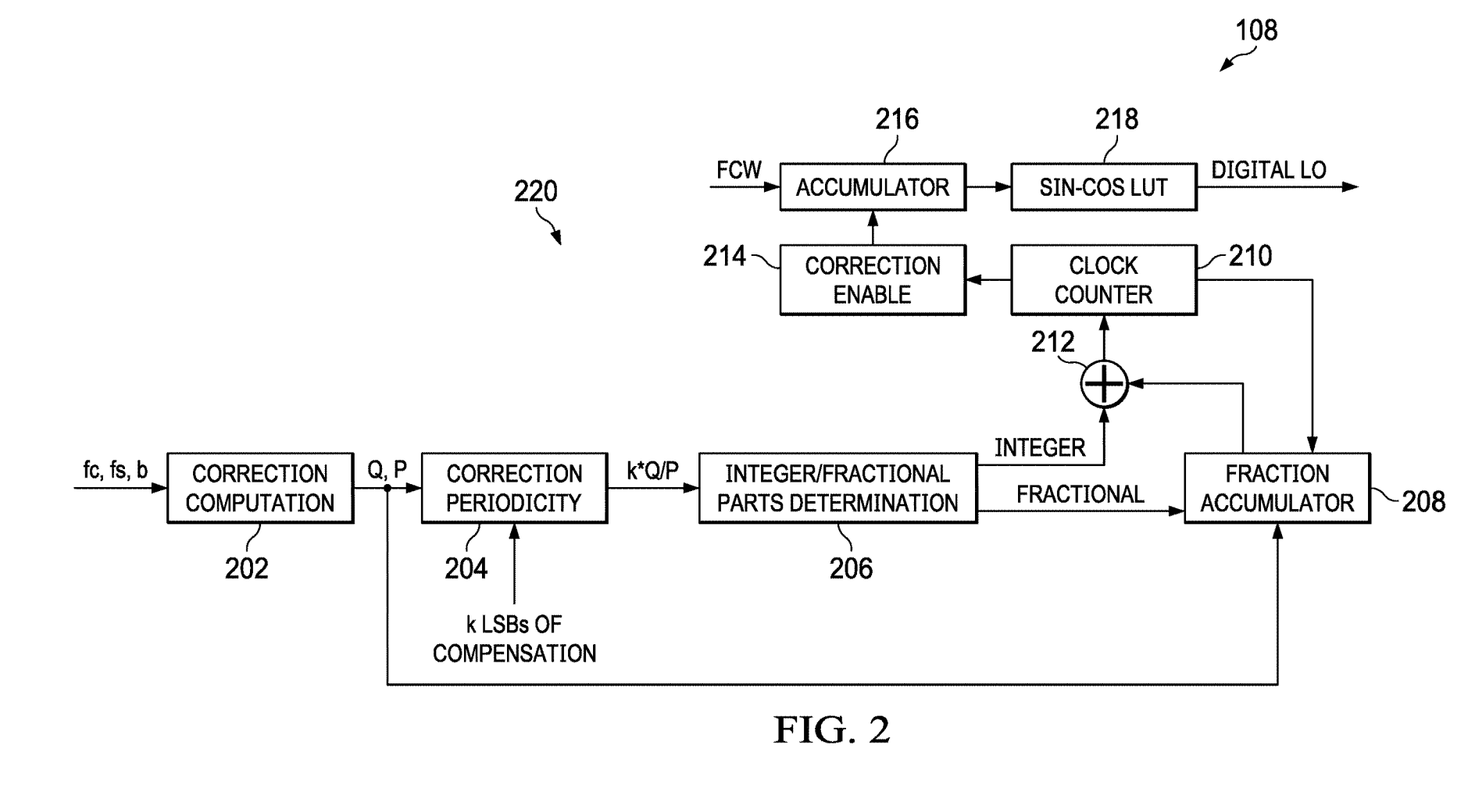
FIG. 2 shows a block diagram for an example digital local oscillator in accordance with the disclosure.

FIG. 2 shows a block diagram for the digital local oscillator 108 in accordance with the disclosure. Some of the functional blocks of the digital local oscillator 108 as shown in FIG. 2 may be implemented by a processor, such as a microcontroller or a microprocessor, and some functional blocks of the digital local oscillator 108 may be implemented as dedicated hardware circuitry. The digital local oscillator 108 includes a signal look-up table 218, a phase accumulator 216, and oscillator control circuitry 220. The oscillator control circuitry 220 includes a correction enable circuit 214, a clock counter 210, a fraction accumulator 208, an incrementer 212, correction computation circuitry 202, correction periodicity determination circuitry 204, and integer/fractional part determination circuitry 206. The correction computation circuitry 202, correction periodicity determination circuitry 204, and integer/fractional part determination circuitry 206 may implemented using a processor executing suitable instructions.

The correction computation circuitry 202 determines how the phase value stored in the phase accumulator 216 should be adjusted to cause the digital local oscillator 108 to produce a selected frequency. The correction computation circuitry 202 receives as input a center frequency value ($f_c$), a sampling frequency value ($f_s$), and a number of bits in which the digital local oscillator frequency is represented (b). The desired frequency of the digital local oscillator is $f_c/f_s$ (referred to as a frequency control word or value). With b bits for representation of the digital local oscillator frequency, the digital local oscillator frequency is $N_{fcw}/2^b$, where $N_{fcw}$ is a b-bit digital frequency control value, and $N_{fcw}$=round($2^b * f_c/f_s$). In some embodiments of the transceiver 100, $f_c$ and $f_s$ are integers, and the desired digital local oscillator frequency $f_c/f_s$ is a rational number.

If the frequency error between the desired digital local oscillator frequency and the actual digital local oscillator frequency ($f_c/f_s - N_{fcw}/2^b$) is non-zero, then the difference is the phase error in one conversion (e.g., one sampling clock cycle) of the ADC 114. $f_c$, $f_s$, and $N_{fcw}$ are integers, so $f_c/f_s - N_{fcw}/2^b$=P/Q, where P and Q are co-prime integers. The correction computation circuitry 202 computes P and Q (the correction parameters) based on $f_c$, $f_s$, and b. P specifies phase error in the digital local oscillator signal as a number of least significant bits of error accumulated in Q ADC clock cycles. For example, if $f_c$=2491.2 megahertz (MHz), $f_s$=3440.640 MHz, b=32, and $N_{fcw}$=1269076553, then P=3 and Q=7.

The correction periodicity determination circuitry 204 determines the time interval (correction period) at which a correction to the accumulated phase is to be made. The correction periodicity determination circuitry 204 receives as input P and Q from the correction computation circuitry 202, and a parameter k, where k specifies the number of LSBs of the accumulated phase to be corrected. The correction periodicity determination circuitry 204 computes k*Q/P. For the example above, where P=3 and Q=7, if k=1, then the output of the correction periodicity determination circuitry 204 is 7/3, which indicates that one LSB of correction (k=1) is to be applied to the accumulated phase every 7/3 (2.$\overline{33}$) ADC clock cycles.

The integer/fractional part determination circuitry 206 splits the period value produced by the correction periodicity determination circuitry 204 into an integer part and a fractional part. For example, in the example above, the integer/fractional part determination circuitry 206 splits Q/P into an integer value of 2 and a fractional value of ⅓.

The integer output of the integer/fractional part determination circuitry 206 is applied to the clock counter 210. The clock counter 210 counts ADC 114 conversion cycles (e.g., ADC sampling clock cycles) to determine when a correction should be applied to the accumulated phase. The fractional output of the integer/fractional part determination circuitry 206 is applied to the fraction accumulator 208. The fraction accumulator 208 counts the corrections enabled by the clock counter 210 to determine when an adjustment should be made to the counter preset value. The fraction accumulator 208 produces an output that the incrementer 212 adds to the integer output of the integer/fractional part determination circuitry 206 to preset the clock counter. In the example above, after the clock counter 210 enables two adjustments to the accumulated phase, the fraction accumulator 208 may assert an output that causes the incrementer 212 to increase (e.g., increment) the preset value provided to the clock counter 210 so that generation of the next phase adjustment enable is delayed by one sampling clock cycle. The added delay accounts for the fractional portion of Q/P accumulated by the fraction accumulator 208.

The correction enable circuit 214 applies an adjustment to the phase value stored in the phase accumulator 216. The adjustment may include adding k to the accumulated phase value. For example, if k=1, then when triggered by the clock counter 210, the correction enable circuit 214 adds 1 to the least significant bit of the phase accumulator 216. Values of k other than 1 may be used in various implementations. In some implementations, the correction enable circuit 214 may temporarily change the frequency control word/value (FCW) to adjust the accumulated phase. For example, the LSB of the frequency control value may be incremented for a single cycle and thereafter returned to the original value.

The phase value stored in the phase accumulator 216 is used to retrieve a signal sample from the signal look-up table 218. The signal look-up table 218 contains digital local oscillator output samples (e.g., sine and/or cosine samples). The phase value provided by the phase accumulator 216 selects one or more of the samples for output. By adjusting the phase value stored in the phase accumulator 216, the digital local oscillator 108 compensates for frequency error introduced by the limited frequency resolution of the phase accumulator 216 to allow the digital local oscillator 108 to produce the frequencies generated by the analog local oscillator 118 without error.

In some implementations of the digital local oscillator 108, the clock counter 210 may enable corrections in a random manner within the constraints of P and Q. In the example above where P=3 and Q=7, 3 LSBs of correction are required every 7 ADC sampling clock cycles. Some implementations may randomize the timing of the three LSBs of adjustment within the 7 clock cycles to spread any phase noise caused by the adjustment.

To further illustrate randomization of the frequency corrections, if P=3, Q=7 and k=3 then the integer/fractional part determination circuitry 206 splits the period value produced by the correction periodicity determination circuitry 204 into an integer part (7) and a fractional part (0). In an implementation of the oscillator control circuitry 220 that randomizes timing of LSB adjustment, the clock counter 210 counts ADC sampling clock cycles, and every 7 ADC sampling clock cycles the phase value stored in the phase accumulator 216 is advanced by 3 LSBs. Within each set of 7 successive ADC sampling clock cycles the time at which the phase value is adjusted may be different. For example, the clock counter 210 may include a first counter and a second counter. The first counter counts the 7 ADC sampling clock cycles forming a phase adjustment window. The second counter is randomly set at the start of each 7 sampling clock cycle window to select 1 of the 7 sampling clock cycles at which the phase adjustment is performed.

Figure 3:
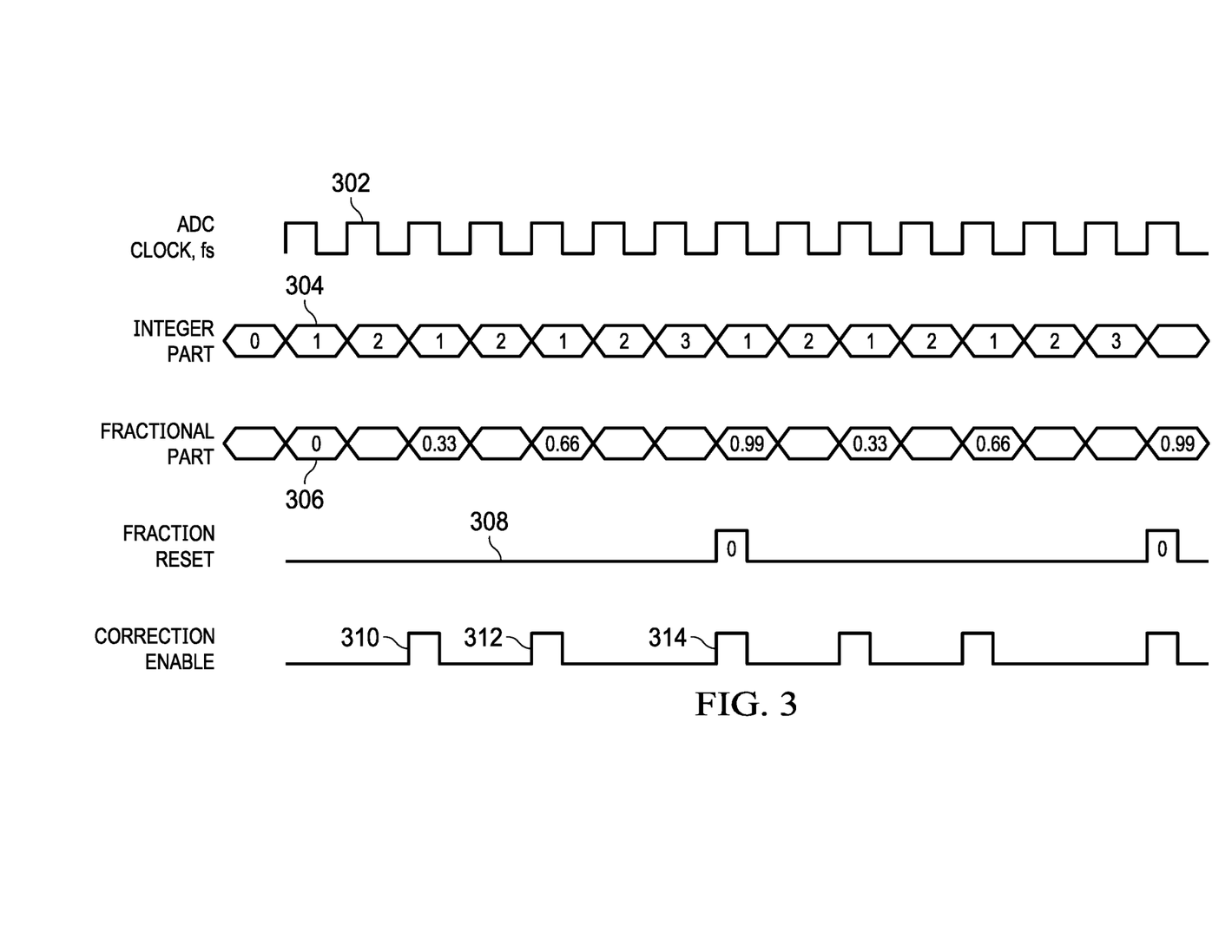
FIG. 3 shows an example timing diagram for signals in a digital local oscillator in accordance with the disclosure.

FIG. 3 shows an example timing diagram for signals in the digital local oscillator 108 in accordance with the disclosure. FIG. 3 illustrates implementation of the digital local oscillator 108 with P=3 and Q=7. The clock counter 210 and the fraction accumulator are incremented by the ADC sampling clock 302. In accordance with P=3 and Q=7, 3 LSBs of adjustment are applied to the phase value stored in the phase accumulator 216 every 7 ADC sampling clock cycles. The clock counter 210 generates count values 304, and the fraction accumulator 208 generates count values 306. After counting an initial two ADC clocks 302, the clock counter 210 triggers correction enable 310 to adjust the accumulated phase. After counting an additional two ADC clocks 302, the clock counter 210 triggers correction enable 312 to adjust the accumulated phase. With generation of the correction enable 312, the fraction accumulator 208 causes the incrementer 212 to change the preset value applied to the clock counter 210 to a value of 3. Accordingly, 3 ADC clocks 302 after the correction enable 312, the clock counter 210 triggers correction enable 314 to adjust the accumulated phase. A fraction reset signal 308 may be provided to reset the fraction accumulator after a predetermined total number of accumulations have been performed (e.g., three accumulation in the example of FIG. 3).

Figure 4:
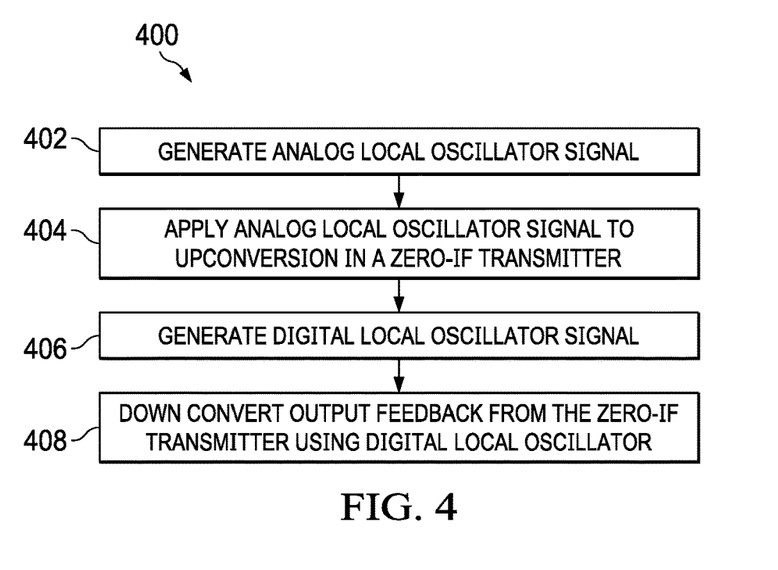
FIG. 4 shows a flow diagram for an example method for operating a wireless transceiver in accordance with the disclosure.

FIG. 4 shows a flow diagram for an example method 400 for operating the wireless transceiver 100 in accordance with the disclosure. Though depicted sequentially as a matter of convenience, at least some of the actions shown can be performed in a different order and/or performed in parallel. Additionally, some embodiments may perform only some of the actions shown.

In block 402, the wireless transceiver 100 generates an analog local oscillator signal. The analog local oscillator signal may be generated by the analog local oscillator 118. For example, the analog local oscillator 118 may include a PLL that can generate all frequencies that are integer multiples of 100 KHz with no frequency error.

In block 404, the zero-IF transmitter 104 applies the analog local oscillator signal to up convert a signal generated by the DAC 122. In some implementations, the zero-IF receiver 106 applies the analog local oscillator signal to down convert RF signals received via the antenna 120.

In block 406, the wireless transceiver 100 generates a digital local oscillator signal. The digital local oscillator signal may be generated by the digital local oscillator 108. The digital local oscillator 108 includes accumulated phase adjustment circuitry that enables the digital local oscillator 108 to generate the digital local oscillator signal at any frequency produced by the analog local oscillator 118 without error.

In block 408, the feedback channel 102 applies the digital local oscillator signal to down convert, in the digital down-converter 116, output signal of the zero-IF transmitter 104 digitized by the RF ADC 114. The down converted signal may be analyzed, for example, to control the predistortion applied to the digital signal provided to the DAC 122.

In some implementations (e.g., transmitter implementations), the digital local oscillator signal is applied in up convert a signal to be transmitted in block 408. In some implementations (e.g., receiver implementations), the digital local oscillator signal is applied in down convert a received signal in block 408.

Figure 5:
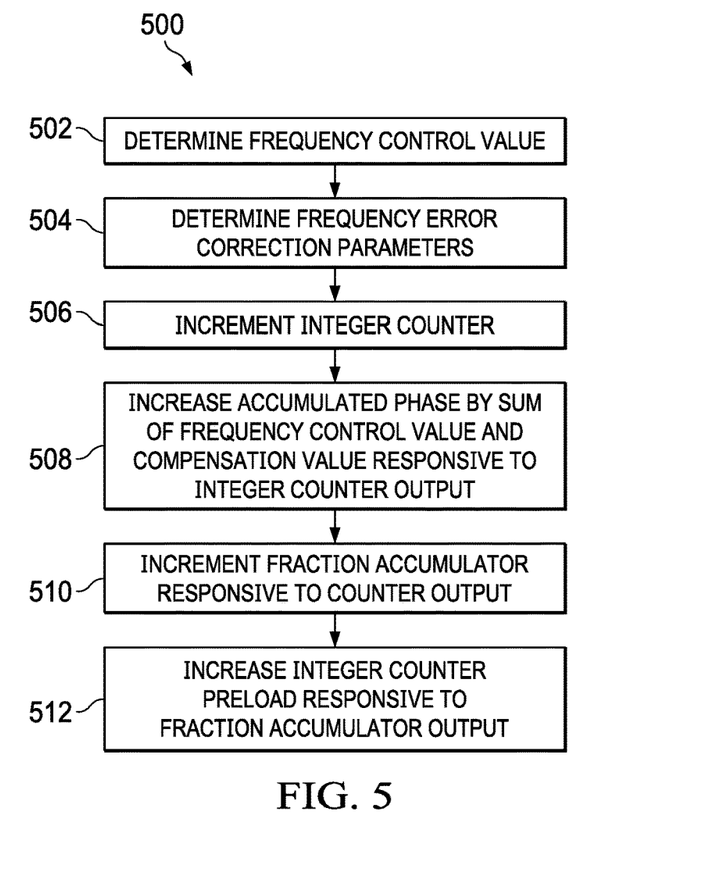
FIG. 5 shows a flow diagram for an example method for generating a digital oscillator signal in accordance with the disclosure.

FIG. 5 shows a flow diagram for an example method 500 for generating a digital oscillator signal in accordance with the disclosure. Though depicted sequentially as a matter of convenience, at least some of the actions shown can be performed in a different order and/or performed in parallel. Additionally, some implementations may perform only some of the actions shown. At least some of the operations of the method 500 may be performed by the digital local oscillator 108.

In block 502, a desired frequency ($f_c/f_s$) of a digital local oscillator signal is selected. A frequency control value ($N_{fcw}$) is selected based on the desired frequency. The frequency control value may be a phase advance value that when added to the phase value stored in the phase accumulator 216, advances the phase value as needed to select a next sample of the digital local oscillator signal from the look-up table 218 to produce the desired frequency. The resolution of the phase accumulator 216 may inhibit generation of the desired frequency without error.

In block 502, the frequency error correction parameters applied to adjust the digital local oscillator signal generated based on the selected frequency control value are determined. The correction computation circuitry 202 determines how the phase value stored in the phase accumulator 216 should be adjusted to cause the digital local oscillator 108 to produce the desired frequency. The correction computation circuitry 202 receives as input the center frequency value ($f_c$), the sampling frequency value ($f_s$), and a number of bits (b) in which the digital local oscillator frequency is represented. With b bits for representation of the digital local oscillator frequency, the digital local oscillator frequency is $N_{fcw}/2^b$.

If the frequency error between the desired digital local oscillator frequency and the actual digital local oscillator frequency ($f_c/f_s - N_{fcw}/2^b$) is non-zero, then the difference is the phase error in one conversion (e.g., one sampling clock) of the ADC 114. $f_c$, $f_s$, and $N_{fcw}$ are integers, so $f_c/f_s - N_{fcw}/2^b = P/Q$, where P and Q are co-prime integers. The correction computation circuitry 202 computes P and Q (the correction parameters) based on $f_c$, $f_s$, and b. P specifies phase error in the digital local oscillator signal as a number of least significant bits of error accumulated in Q ADC clock cycles.

The correction periodicity determination circuitry 204 determines the time interval (correction period) at which a correction to the accumulated phase should be made. The correction periodicity determination circuitry 204 receives as input P and Q from the correction computation circuitry 202, and a parameter k, where k specifies the number of LSBs of the accumulated phase to be corrected at a given time instant. The correction periodicity determination circuitry 204 computes k*Q/P. The integer/fractional part determination circuitry 206 splits the period value produced by the correction periodicity determination circuitry 204 into an integer part and a fractional part.

In block 506, the clock counter 210 applies the integer part of the period value to determine when a correction is to be applied to the accumulated phase by counting clock cycles of the ADC 114. When the clock counter 210 has counted a number of ADC clock cycles equal to the integer part, the clock counter 210 enables adjustment of accumulated phase (e.g., the clock counter generates a carry-out to enable adjustment of accumulated phase).

In block 508, the accumulated phase value stored in the phase accumulator is updated responsive to assertion of a correction signal by the clock counter 210. The total value applied to update the phase value is a sum of the frequency control value and one or more LSB values provided by the correction enable circuit 214. For example, in FIG. 2, k LSBs of correction are provide by the correction enable circuit 214.

In block 510, the fraction accumulator 208 counts the corrections enabled by (e.g., counts the carry-outs generated by) the clock counter 210 to determine when an adjustment should be made to the integer preset value applied to the clock counter 210. The fraction accumulator 208 may be reset to an initial value after a predetermined total number of accumulations or ADC clock cycles (e.g., after P LSBs of correction have been applied or Q ADC clock cycles).

In block 512, the fraction accumulator 208 produces an output that the incrementer 212 adds to the integer part of the period value to preset the clock counter 210. Increasing the value used to preset the clock counter 210 delays generation of the next phase adjustment enable. The added delay accounts for the fractional portion of Q/P accumulated by the fraction accumulator 208. By adjusting the phase value stored in the phase accumulator 216, the digital local oscillator 108 compensates for frequency error introduced by the limited frequency resolution of the phase accumulator 216 to allow the digital local oscillator 108 to produce the frequencies generated by the analog local oscillator 118 without error.

While the digital local oscillator 108 has been described above with respect to the feedback channel 102. Implementations of the digital local oscillator 108 may be utilized in a variety of applications. For example, implementations of the digital local oscillator 108 may be applied in a wired or wireless receiver that includes digital down conversion, and/or in a wired or wireless transmitter that includes digital up conversion.

Figure 6:
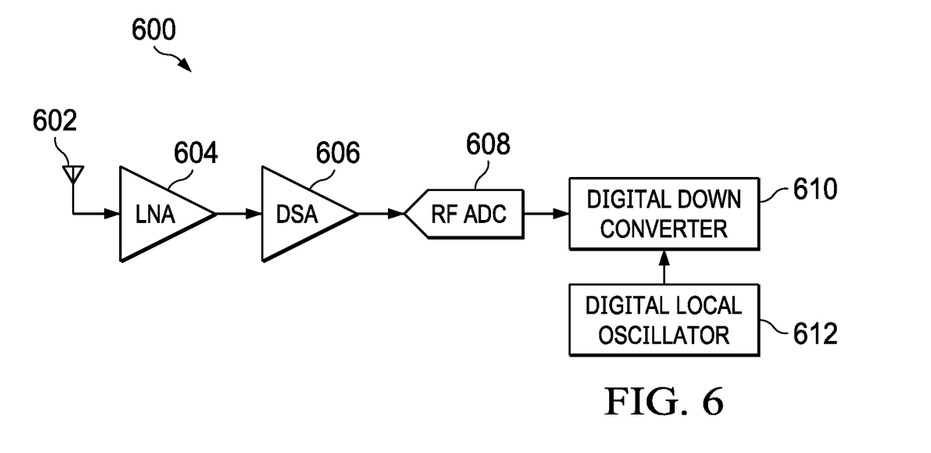
FIG. 6 shows a block diagram for an example wireless receiver in accordance with the disclosure.

FIG. 6 shows a block diagram for an example wireless receiver 600 in accordance with the disclosure. The wireless receiver 600 includes an antenna 602 a low noise amplifier (LNA) LNA 604, a digital step attenuator (DSA) 606, an RF ADC 608, a digital down converter (DDC) 610, and a digital local oscillator 612. The RF ADC 608 digitizes RF signals that are detected by the antenna 602, amplified by the LNA 604, and attenuated by the DSA 606. The DDC 610 down converts the digitized RF signals to base-band or to one or more selected intermediate frequency by multiplying digital samples received from the RF ADC 108 with samples of digital local oscillator signal generated by the digital local oscillator 612.

The digital local oscillator 612 is an implementation of the digital local oscillator 108. The digital local oscillator 612 provides digital oscillator signal samples to the DDC 610 for use in down conversion of received RF signals. As explained with regard to the digital local oscillator 108, the digital local oscillator 612 compensates for frequency error introduced by the limited frequency resolution of a phase accumulator (e.g., the phase accumulator 216) of the digital local oscillator 612, to allow the digital local oscillator 612 to produce an output signal with a higher frequency resolution than is provided by the LSB of the phase accumulator. For example, the digital local oscillator 612 may generate an output signal frequency that matches a transmitted frequency that can be any multiple of 100 KHz.

Figure 7:
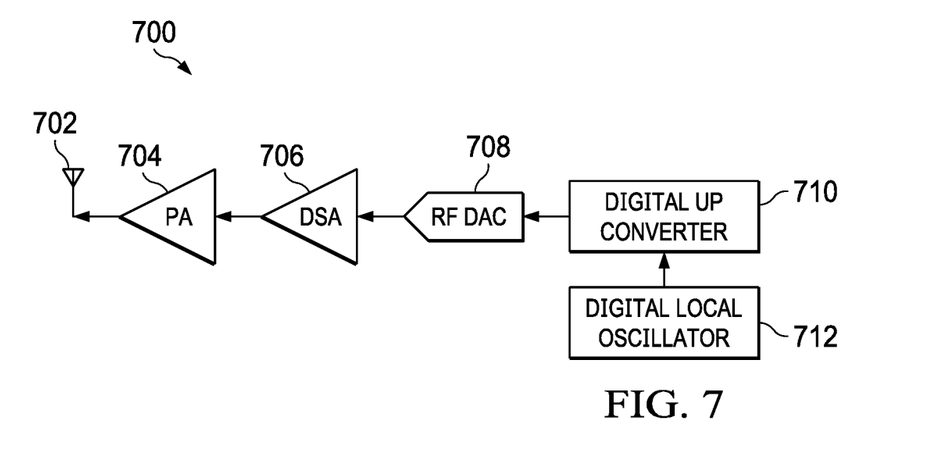
FIG. 7 shows a block diagram for an example wireless transmitter in accordance with the disclosure.

FIG. 7 shows a block diagram for an example wireless transmitter 700 in accordance with the disclosure. The wireless transmitter 700 includes an antenna 702 a power amplifier (PA) 704, a digital step attenuator (DSA) 706, an RF DAC 708, a digital up converter (DUC) 710, and a digital local oscillator 712. The digital local oscillator 712 is an implementation of the digital local oscillator 108. The digital local oscillator 712 provides digital oscillator signal samples to the DUC 710 for use in up conversion of digital signals to be transmitted. As explained with regard to the digital local oscillator 108, the digital local oscillator 712 compensates for frequency error introduced by the limited frequency resolution of a phase accumulator (e.g., the phase accumulator 216) of the digital local oscillator 712, to allow the digital local oscillator 712 to produce an output signal with a higher frequency resolution than is provided by the LSB of the phase accumulator. For example, the digital local oscillator 712 may generate an output signal frequency that can be any multiple of 100 KHz.

The DUC 710 mixes digital values to be transmitted with digital oscillator signal samples provided by the digital local oscillator 712. The output of the DUC 710 is converted to analog signals by the RF DAC 708. The analog signals are attenuated by the DSA 706 and amplified by the PA 704. The output of the PA 704 is provided to the antenna 702 for transmission.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A digital local oscillator, comprising:
   a look-up table containing samples of a digital local oscillator signal; and
   oscillator control circuitry configured to:
   select samples of the digital local oscillator signal from the look-up table based on an accumulated phase value;
   update the accumulated phase value based on a frequency control value; and
   add a correction value to the accumulated phase value based on a difference of a frequency of the digital local oscillator signal and a desired frequency being at least as great as a frequency specified by a predetermined number of least significant bits (LSBs) of the accumulated phase value.

2. The digital local oscillator of claim 1, wherein the oscillator control circuitry is configured to:
   determine a number of LSBs of adjustment to apply to the accumulated phase value; and
   determine a number of clock cycles over which the number of LSBs of adjustment is to be applied;
   wherein the number of LSBs and the number of clock cycles are determined based on the desired frequency, a frequency of the clock cycles, and a total number of bits of the frequency control value.

3. The digital local oscillator of claim 2, wherein the oscillator control circuitry is configured to determine a period for applying the correction value to the accumulated phase value based on the number of LSBs of adjustment, the number of clock cycles, and a number of LSBs to be adjusted at a given time.

4. The digital local oscillator of claim 3, wherein the oscillator control circuitry is configured to divide the period into an integer part and a fractional part.

5. The digital local oscillator of claim 4, wherein the oscillator control circuitry comprises:
   a counter configured to be incremented with each clock cycle; and
   a fraction accumulator configured to accumulate the fractional part with each carry-out of the counter generated by counting a number of the clock cycles corresponding to the integer part.

6. The digital local oscillator of claim 5, wherein the counter is configured to trigger addition of the correction value to the accumulated phase value based on a number of clock cycles being equal to the integer part.

7. The digital local oscillator of claim 5, wherein the fraction accumulator is configured to generate a carry signal to be added to the integer part and the counter is configured to trigger addition of the correction value to the accumulated phase value based on a number of clock cycles being equal to the integer part incremented by the carry signal.

8. The digital local oscillator of claim 5, wherein the fraction accumulator is configured to set an accumulated fractional value to an initial value based on a number of clock cycles being equal to a number of clock cycles over which the number of LSBs of adjustment is to be applied.

9. A method for generating a digital local oscillator signal, comprising:
   selecting samples from a digital local oscillator signal look-up table based on an accumulated phase value;
   updating the accumulated phase value based on a frequency control value; and
   adding a correction value to the accumulated phase value based on a difference of a frequency of the digital local oscillator signal and a desired frequency being at least as great as a frequency specified by a predetermined number of least significant bits (LSBs) of the accumulated phase value.

10. The method of claim 9, further comprising:
    determining a number of LSBs of adjustment to apply to the accumulated phase value; and
    determining a number of clock cycles over which the number of LSBs of adjustment is to be applied;
    wherein the number of LSBs and the number of clock cycles are determined based on the desired frequency, a frequency of the clock cycles, and a total number of bits of the frequency control value.

11. The method of claim 10, further comprising determining a period for applying the correction value to the accumulated phase value based on the number of LSBs of adjustment, the number of clock cycles, and a number of LSBs to be adjusted at a given time.

12. The method of claim 11, further comprising dividing the period into an integer part and a fractional part.

13. The method of claim 12, further comprising:
    incrementing a counter with each clock cycle; and
    accumulating the fractional part with each carry-out of the counter generated by counting a number of the clock cycles corresponding to the integer part.

14. The method of claim 13, further comprising initiating addition of the correction value to the accumulated phase value based on a number of clock cycles being equal to the integer part.

15. The method of claim 13, further comprising:
    generating, responsive to the accumulating, a carry signal to be added to the integer part; and
    initiating addition of the correction value to the accumulated phase value based on a number of clock cycles being equal to the integer part incremented by the carry signal.

16. The method of claim 13, further comprising setting an accumulated fractional value to an initial value based on a number of clock cycles being equal to a number of clock cycles over which the number of LSBs of adjustment is to be applied.

17. A radio frequency transceiver, comprising:
a digital local oscillator configured to generate a digital local oscillator signal for use in up converting or down converting a digitized signal, the digital local oscillator comprising:
a look-up table containing samples of the digital oscillator signal;
a phase accumulator configured to update an accumulated phase value based on a frequency control value; and
oscillator control circuitry configured to:
synchronize a frequency of the digital oscillator signal to a desired frequency, wherein the desired frequency is not an integer multiple of a frequency resolution of the digital local oscillator;
add a correction value to the accumulated phase value based on a difference of the frequency of the digital local oscillator signal and the desired frequency being at least as great as a frequency specified by a predetermined number of least significant bits (LSBs) of the accumulated phase value;
determine the correction value as a number of LSBs of adjustment to apply to the accumulated phase value; and
determine a number of clock cycles over which the correction value is to be applied;
wherein the number of LSBs and the number of clock cycles are determined based on the desired frequency, a frequency of the clock cycles, and a number of bits in the accumulated phase value.

18. The radio frequency transceiver of claim 17, wherein the oscillator control circuitry further comprises:
periodicity determination circuitry configured to determine a correction period for applying the correction value to the accumulated phase value based on the number of LSBs of adjustment, the number of clock cycles, and a number of LSBs to be adjusted at a given time; and
integer/fraction determination circuitry configured to divide the period into an integer part and a fractional part.

19. The radio frequency transceiver of claim 18, further comprising:
a counter configured to be incremented with each clock cycle;
a fraction accumulator configured to accumulate the fractional part with carry-out of the counter generated by counting a number of clock cycles corresponding to the integer part;
wherein the counter is configured to trigger addition of the correction value to the accumulated phase value based on a number of clock cycles being equal to the integer part.

20. The radio frequency transceiver of claim 19, wherein the fraction accumulator is configured to:
generate a carry signal to be added to the integer part and the counter is configured to trigger addition of the correction value to the accumulated phase value based on a number of clock cycles being equal to the integer part incremented by the carry signal; and
set an accumulated fractional value to an initial value based on a number of clock cycles being equal to a number of clock cycles over which the number of LSBs of adjustment is to be applied.

* * * * *